(12) United States Patent
Welstand

(10) Patent No.: US 6,469,383 B1
(45) Date of Patent: Oct. 22, 2002

(54) FLIP-CHIP TRANSITION INTERFACE STRUCTURE

(75) Inventor: Robert B. Welstand, San Diego, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 09/957,439

(22) Filed: Sep. 17, 2001

(51) Int. Cl.[7] .......................... H01L 23/48; H01L 23/52; H01L 29/40
(52) U.S. Cl. .................. 257/737; 257/738; 257/778
(58) Field of Search .................. 257/737, 738, 257/778

(56) References Cited

U.S. PATENT DOCUMENTS

| | | |
|---|---|---|
| 5,987,767 A | 3/1996 | Huddleston et al. |
| 5,528,203 A | 6/1996 | Mohwinkel et al. |
| 5,668,512 A | 9/1997 | Mohwinkel et al. |
| 5,854,534 A * | 1/1999 | Beilin et al. ............ 257/691 |
| 6,100,775 A | 8/2000 | Wen |

OTHER PUBLICATIONS

Heinrich et al, "Millimeter–Wave Characteristics Of Flip-Chip Interconnects For Multichip Modules", IEEE Transactions On Microwave Theory And Techniques, vol. 46, No12, Dec. 1998. .

Hirose et al, "A Flip–Chip MMIC Design With Coplanar Waveguide Transmission Line In The W–Band", IEEE Transactions On Microwave Theory And Techniques, vol. 46, No. 12, Dec. 1998.

Iwasaki et al, "Packaging Technology For 40–Gb/s Optical Receiver Module With An MU–Connector Interface", IEEE 2000, Electronic Components And Technology Conference.

* cited by examiner

Primary Examiner—David E. Graybill
(74) Attorney, Agent, or Firm—Gray Cary Ware & Freidenrich

(57) ABSTRACT

A flip-chip transition interface structure is suitable for use in high speed applications that require low return losses. The transition interface includes a conductive signal element and two conductive reference elements formed on a flip-chip die substrate. A signal solder bump is located at a signal bond pad formed at an end of the conductive signal element, and a reference solder bump is located at each conductive reference element. The conductive elements are configured to form a substantially round cutout region surrounding the signal bond pad. The positions of the solder bumps on the respective conductive elements are selected in a manner that enhances the impedance matching of the transition interface structure.

15 Claims, 7 Drawing Sheets

FLIP-CHIP TRANSITION INTERFACE STRUCTURE

RELATED APPLICATIONS

The subject matter disclosed herein is related to the subject matter disclosed in U.S. patent application Ser. No. 09/957,115, filed Sep. 17, 2001, and to the subject matter disclosed in U.S. patent application Ser. No. 09/957,007, filed Sep. 17, 2001.

FIELD OF THE INVENTION

The present invention relates generally to electronic circuit packaging techniques. More particularly, the present invention relates to flip-chip interconnect techniques.

BACKGROUND OF THE INVENTION

Flip-chip mounting techniques are utilized to interconnect a chip-based electronic device to another device, a circuit board, a connecting substrate, or the like. Flip-chip devices typically include solder bumps that are bonded to contact pads located on the chip substrate. The solder bumps are reflowed to establish electrical and physical connections between the chip and the connected device, board, or substrate. Flip-chip techniques are gaining acceptance for use in high frequency applications having strict impedance matching requirements.

Flip-chip transition interfaces for high frequency applications typically are fed by coplanar waveguides or microstrip transmission lines that carry electronic signals. For example, the flip-chip device can include an output waveguide section and a transition or interconnect section for coupling the device to a second substrate. The second substrate can include a waveguide section and a corresponding transition or interconnect section for receiving the output signal generated by the device (this concept also applies where the first substrate receives an electrical signal from the second substrate). The two transition sections are connected together using solder bumps. Much of the prior art for millimeter wave and sub-millimeter wave electronic interface circuits has focused on the use of reactive matching networks to provide impedance matching at very high frequencies. Used in conjunction with circuit interconnects, reactive matching networks compensate for impedance mismatch between the characteristic impedance of the interconnect and the impedance of the source or load circuit. One aspect of using such compensating networks is that the impedance match is usually limited over a frequency range. In this regard, such matching circuits are common in high center frequency, fractional bandwidth systems.

Some prior art techniques attempt to provide a broadband impedance match to high frequencies, particularly in the digital optical communications sector, which requires both DC and high frequency components to reconstruct electronic information signals. High speed circuits that transmit and receive signals between other high speed circuits, and other optoelectronic devices, can achieve rise and fall times in the 10–13 picosecond range. Newer designs may require even lower rise and fall times, e.g., in the 6–8 picosecond range. The corresponding transition interface structures and interconnect circuits will need to accommodate bandwidths of up to 100 GHz to support these low rise and fall times.

Accordingly, a need exists for optimized flip-chip transition interface designs for high frequency and broad bandwidth applications.

BRIEF SUMMARY OF THE INVENTION

The techniques of the present invention may be employed to provide a flip-chip transition interface structure having acceptable broadband impedance matching characteristics. A transition interface structure according to the present invention employs a suitably designed ground cutout region surrounding the chip signal bond pad. In accordance with another aspect of the present invention, the layout of the transition interface structure contemplates the relative positioning of the solder bumps located on the output signal bond pad and on the surrounding ground elements.

The above and other aspects of the present invention may be carried out in one form by a flip-chip transition interface structure having a conductive signal element, a substantially round bond pad formed at an end of the conductive signal element, a first conductive reference element including a first substantially curved edge, a second conductive reference element including a second substantially curved edge, and a cutout region defined at least in part by the first curved edge and the second curved edge.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The particular implementations shown and described herein are illustrative of the invention and its best mode and are not intended to otherwise limit the scope of the invention in any way. Indeed, for the sake of brevity, conventional techniques related to electronic device manufacturing, coplanar waveguide design, flip-chip design, solder bump composition, deposition, and reflow, and other aspects of the interconnect structures may not be described in detail herein.

Figure 1:
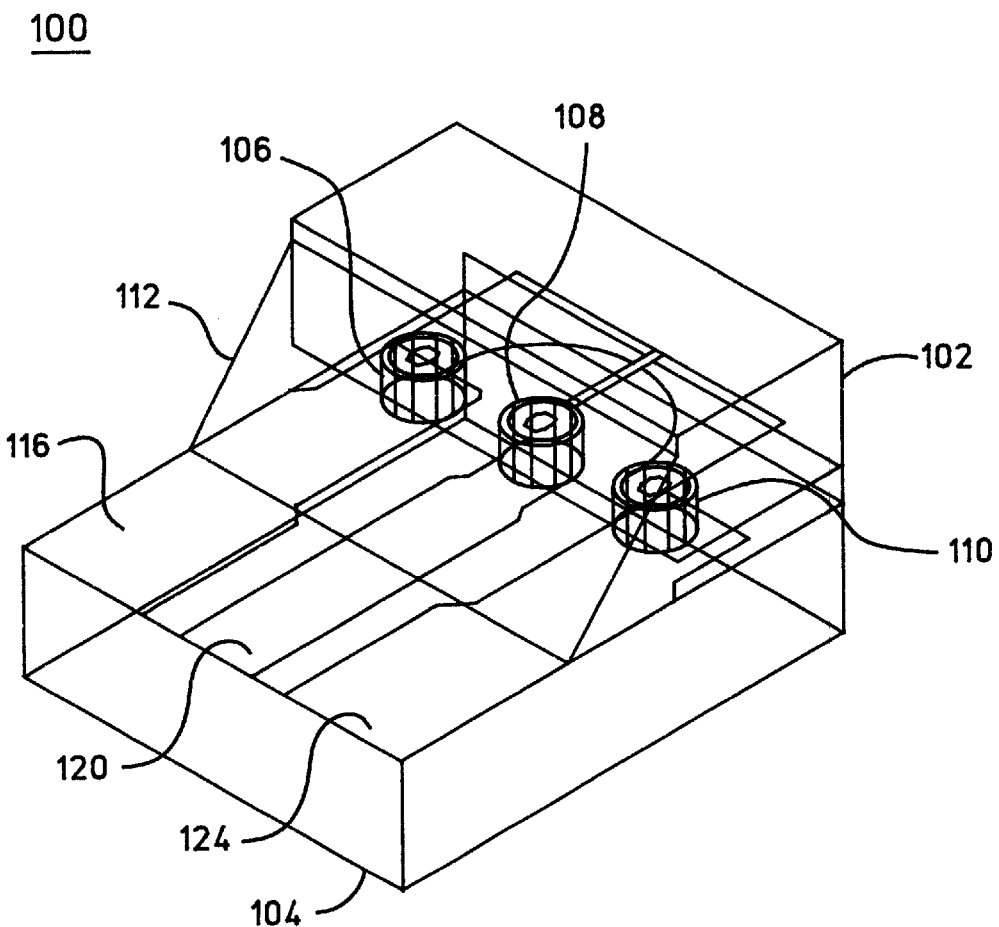
FIG. 1 is a perspective phantom view of a circuit package including a flip-chip transition interface structure.
Figure 2:
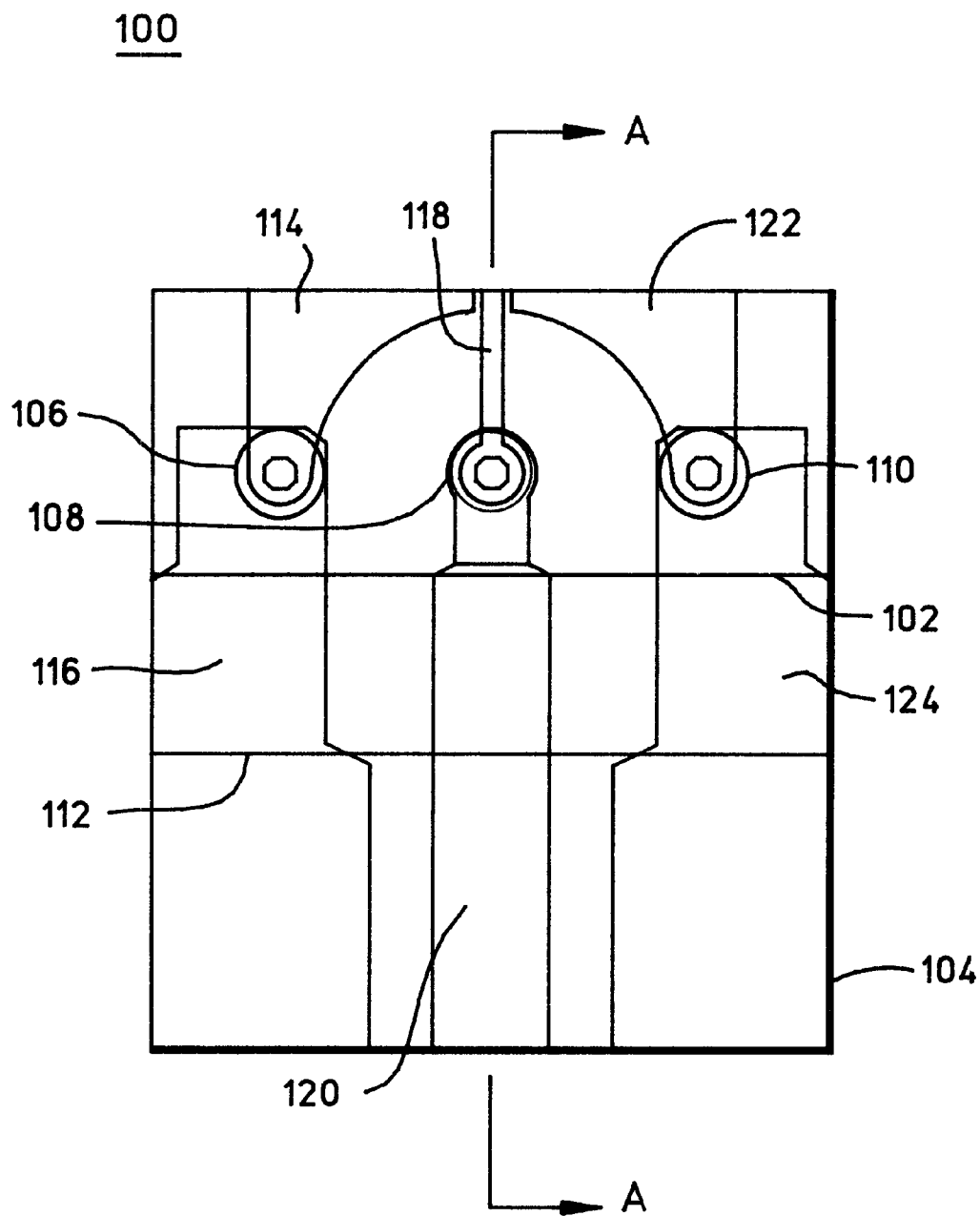
FIG. 2 is a top phantom view of the circuit package shown in FIG. 1.
Figure 3:
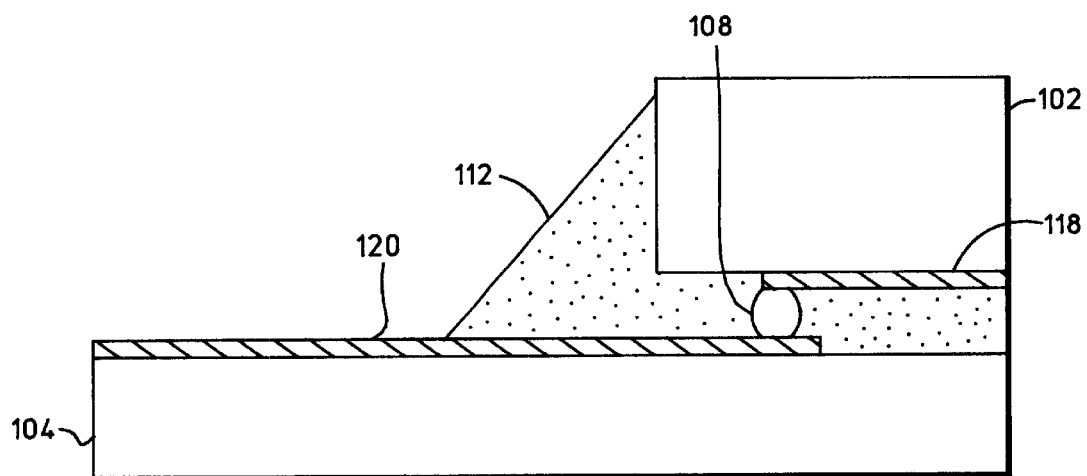
FIG. 3 is a cross sectional view of the circuit package as viewed from line A—A in FIG. 2.

FIG. 1 is a perspective phantom view of a circuit package 100 including a flip-chip transition interface structure, FIG. 2 is a top phantom view of circuit package 100, and FIG. 3 is a cross sectional view of circuit package 100 as viewed from line A—A in FIG. 2. FIG. 1 and FIG. 2 depict several components of circuit package 100 that would normally be hidden from view. The scaling used in FIG. 3 is exaggerated for ease of illustration.

Circuit package 100 generally includes a die substrate 102, a second substrate 104, conductive interconnect elements (e.g., solder bumps) 106, 108, 110, and a dielectric underfill material 112 located between die substrate 102 and second substrate 104. The outer periphery of dielectric underfill material 112 is shown in FIG. 2. In practical applications, die substrate 102 is a portion of an integrated circuit, electronic device, or chip. For example, die substrate 102 can be included in a flip-chip integrated circuit (the Figures do not depict the entire die substrate or the circuit; the Figures only depict a section of the circuit corresponding to one transition interface). The operation of the circuit device, the electrical specifications of the device, and the physical specifications of the flip-chip package may vary from application to application. In accordance with one practical embodiment, the flip-chip circuit transmits or receives a high speed digital signal (e.g., a signal having a data rate of up to 48 Gb/s). The flip-chip circuit can be utilized in a broadband optoelectronic or electronic application that requires high bandwidth, which may exceed 100 GHz. In such applications, the return loss caused by the interface structure should be kept at a minimum over the specified bandwidth to maintain signal fidelity. For example, many electronic applications specify that the signal return loss be no greater than −10 dB or −15 dB across the entire band. Circuit package 100 can satisfy these practical requirements by utilizing the techniques described herein.

Second substrate 104 can be realized in a number of different contexts. For example, second substrate 104 may be an interposer substrate, e.g., a substrate used to fan out to a second-level interconnect. Alternatively, second substrate 104 may be a circuit board substrate, e.g., a substrate used in a printed circuit board, a substrate used in a multichip module, or the like. Alternatively, second substrate 104 may be another die substrate associated with a second electronic or optoelectronic device or package. Generally, the techniques of the present invention can be employed where a signal from one electronic chip device is routed from one substrate to another substrate. Although the example embodiments described herein utilize coplanar waveguides, the techniques of the present invention can be applied to grounded coplanar waveguide, slot line, strip line, coplanar strips, coupled microstrip, coupled coplanar waveguide, and/or hybrid assemblies.

The transition interface structure may be generally defined to include a number of conductive elements formed on die substrate 102, a number of conductive elements formed on second substrate 104, and solder bumps 106, 108, 110. Solder bumps 106, 108, 110 provide electrical coupling between conductive elements formed on die substrate 102 and corresponding conductive elements formed on second substrate 104. For example, solder bump 106 couples a conductive reference element 114 formed on die substrate 102 to a conductive reference element 116 formed on second substrate 104, solder bump 108 couples a conductive signal element 118 formed on die substrate 102 to a conductive signal element 120 formed on second substrate 104, and solder bump 110 couples a conductive reference element 122 formed on die substrate 102 to a conductive reference element 124 formed on second substrate 104. Although solder bumps are often used in practical applications, circuit package 100 can employ any suitable conductive interconnect element, device, or composition, such as gold bumps, AuSn, indium preforms, copper pillars, wire-reinforced columns, solder columns, conductive epoxies, and lead-free solders (such as SnAgCu, or SnBiAg).

As best shown in FIG. 3, conductive signal element 118 (along with conductive reference elements 114, 122) are formed on an outer surface of die substrate 102. When circuit package 100 is assembled, the conductive elements on die substrate 102 face the conductive elements (e.g., conductive signal element 120) formed on second substrate 104. Solder bumps, including solder bumps 106, 108, 110, provide an electrical and physical connection between the two substrates. Dielectric underfill material 112 provides additional structural integrity to the assembly and provides stress relief between the two substrates.

Figure 4:
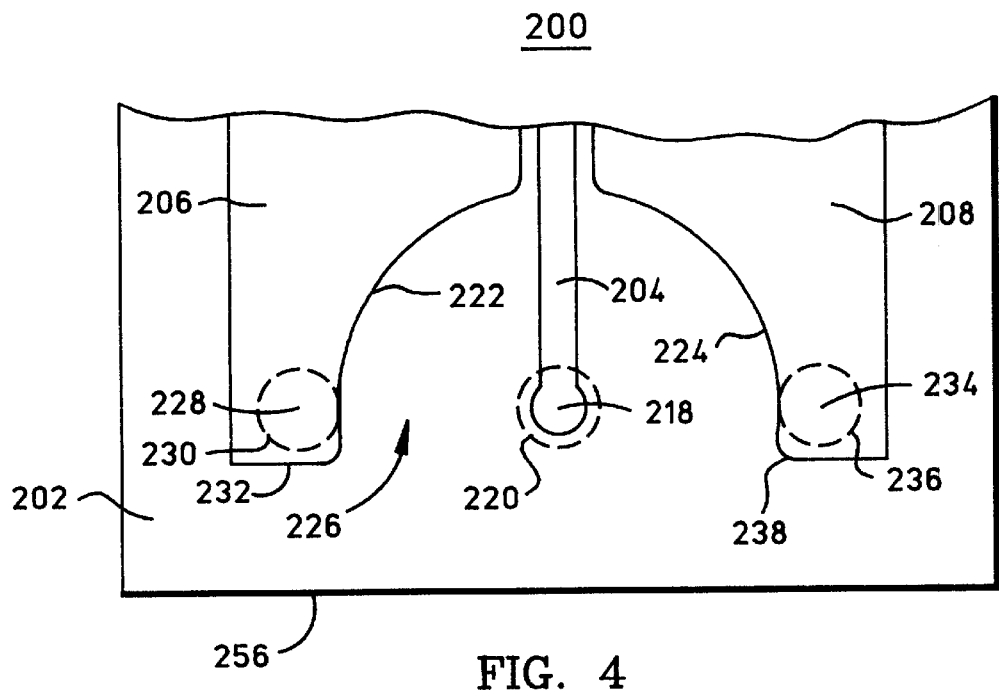
FIG. 4 is a top view of a die portion of a flip-chip transition interface structure.
Figure 5:
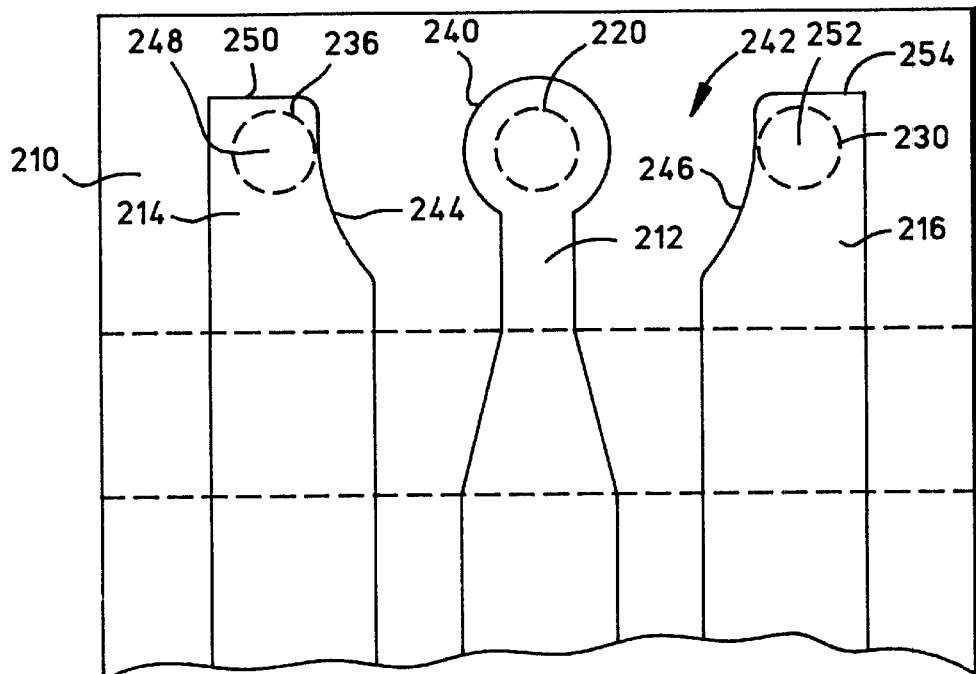
FIG. 5 is a top view of a substrate portion of a flip-chip transition interface structure compatible with the die portion shown in FIG. 4.
Figure 6:
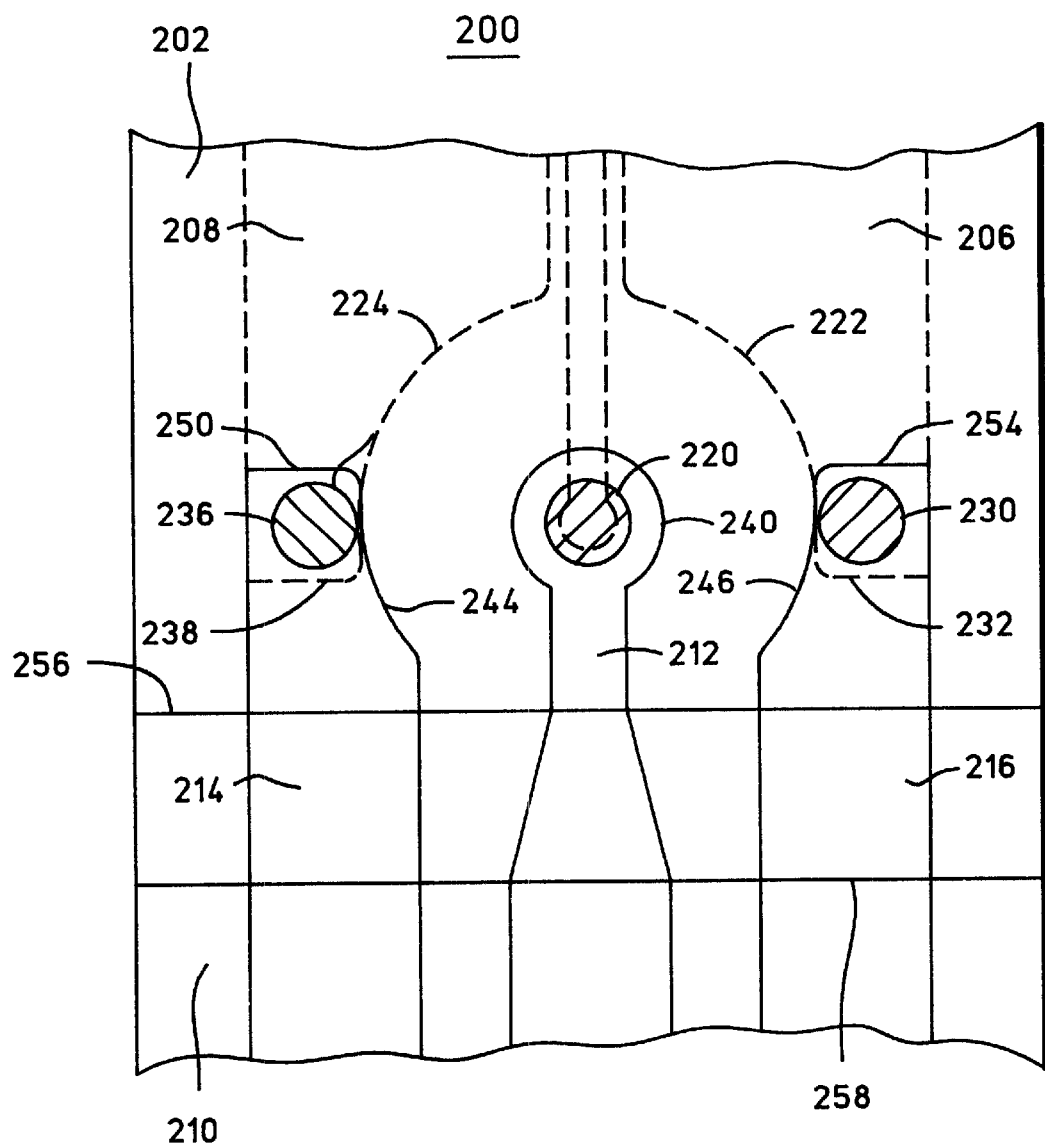
FIG. 6 is a top phantom view of a flip-chip transition interface that includes the die portion shown in FIG. 4 and the substrate portion shown in FIG. 5.

FIGS. 4–6 depict an alternate transition interface structure 200 configured in accordance with the present invention. Transition interface structure 200 may be utilized in connection with a flip-chip device, as described above in connection with FIGS. 1–3. FIG. 4 is a top view of a die substrate 202 having a conductive signal element 204, a conductive reference element 206, and a conductive reference element 208. FIG. 5 is a top view of a second substrate 210 having a conductive signal element 212, a conductive reference element 214, and a conductive reference element 216. FIG. 6 is a top phantom view of transition interface 200 that includes the die portion shown in FIG. 4 coupled to the substrate portion shown in FIG. 5. FIG. 6 depicts features on die substrate 202 in dashed lines.

Conductive signal element 204 and conductive reference elements 206, 208 are configured such that they feed into (or form) a coplanar waveguide on die substrate 202. Only a small portion of the coplanar waveguide is shown in FIG. 4 and FIG. 6; in a practical embodiment, the conductive elements can extend to a suitable length appropriate for the particular application. Similarly, conductive signal element 212 and conductive reference elements 214, 216 are configured such that they feed into (or form) a coplanar waveguide on second substrate 210. The coplanar waveguides may be suitably configured to achieve a desired transmission impedance, e.g., 50 Ohms.

Referring to FIG. 4, conductive signal element 204 is substantially uniform in width throughout the coplanar waveguide portion. In accordance with one example embodiment, conductive signal element 204 is approximately 21 microns wide, and the gap between conductive signal element 204 and each of the conductive reference elements 206, 208 is approximately 13 microns. The width, shape, layout, and other aspects of conductive signal element 204 may vary as it approaches the region of transition interface structure 200. Subject to dimensional requirements of the transition interface, the dimensions for the feeding coplanar waveguide elements can be determined independently of the transition interface. Conductive signal element 204 ends at a suitably configured bond pad 218 formed on die substrate 202. In the example embodiment, bond pad 218 is substantially round in shape, which enhances the impedance matching of transition interface structure 200, and is smaller in diameter than solder bump 220. Bond pad 218 is suitably sized, shaped, and configured to accommodate a conductive interconnect element, e.g., a solder bump 220. In one preferred embodiment, the size of bond pad 218 is the minimum required to contact and bond with solder bump 220. In the example embodiment, bond pad 218 is approximately 76 microns in diameter. In a practical implementation, bond pad 218 may be realized as a multi-sided polygon having a large number of sides that effectively form a circular shape.

Conductive reference element 206 includes a substantially curved edge 222, and conductive reference element 208 includes a substantially curved edge 224. In the illustrated embodiment, each of the curved edges 222, 224 is primarily arcuate in shape, i.e., each curved edge 222, 224 substantially defines a circular arc having a radius of about 215 microns. As described above in connection with bond pad 218, each of the curved edges 222, 224 may be realized as a section of a multi-sided polygon having a large number of sides that effectively forms a curved line (a simple curve can be formed from a three-segment arc section). The conductive reference elements are configured such that a cutout region 226 is defined at least in part by curved edges 222, 224. As shown in FIG. 4, cutout region 226 may be further defined by bond pad 218 and by portions of conductive signal element 204. As described in more detail below, cutout region 226 is preferably configured to enhance the impedance matching of transition interface structure 200. In this respect, cutout region 226 can be configured according to any suitable impedance matching criteria.

Conductive reference element 206 includes a reference bond pad 228 configured to accommodate a conductive interconnect element, e.g., a solder bump 230. In the example embodiment, reference bond pad 228 is located at protruding extremity 232 of conductive reference element 206. Similarly, conductive reference element 208 includes a reference bond pad 234 configured to accommodate a solder bump 236. As shown in FIG. 4 and FIG. 6, reference bond pad 234 is located at protruding extremity 238 of conductive reference element 208. The positions of bond pad 218, reference bond pad 228, and reference bond pad 234 on die substrate 202 are determined in accordance with a suitable impedance matching criteria to enhance the impedance matching characteristics of transition interface structure 200. In the example embodiment, the bond pads are located such that the solder bumps are collinear and parallel to the die/substrate edges.

In a flip-chip implementation, solder bumps 220, 230, 236 can be formed on the respective bond pads 218, 228, 234. In this manner, a flip-chip device can be assembled into a package subassembly, mounted to a circuit board, or mounted to an interposer substrate in a conventional manner. The positions of solder bumps 220, 230, 236 (individually or in any combination) are determined in accordance with a suitable impedance matching criteria to enhance the performance of transition interface structure 200. In this regard, the locations of bond pads 218, 228, 234 on die substrate 202 and the positions of solder bumps 220, 230, 236 on the respective bond pads 218, 228, 234 can be treated as variable design parameters that are optimized or selected in a manner that satisfies one or more performance requirements.

In the illustrated embodiment, solder bump 230 is located at curved edge 222 and solder bump 236 is located at curved edge 224. As shown in FIG. 4, the contact footprint of solder bump 230 approaches curved edge 222 at protruding extremity 232. Similarly, the contact footprint of solder bump 236 approaches curved edge 224 at protruding extremity 238. For this example, the positions of solder bumps 230, 236 at curved edges 222, 224 were selected to improve the impedance matching and reduce the return loss associated with transition interface structure 200. In an alternate embodiment, the solder bumps can be displaced away from the curved edges to intentionally alter the impedance matching characteristics. Such a technique can be used to tune or limit the upper frequency match bandwidth in a practical embodiment. The technique can also be used to create a bandpass or a blockband filter as part of the flip-chip transition region.

Referring to FIG. 5, conductive signal element 212 is substantially uniform in width throughout the coplanar waveguide portion (which begins at the bottom of FIG. 5). In accordance with one example embodiment, conductive signal element 212 is approximately 140 microns wide in the coplanar waveguide region, and the gap between conductive signal element 212 and each of the conductive reference elements 214, 216 is approximately 84 microns in the coplanar waveguide region. The width of conductive signal element 212 can vary along certain segments to facilitate an enhanced impedance match. For example, the width, shape, layout, and other aspects of conductive signal element 212 may vary as it approaches the cutout region of transition interface structure 200. In addition, the configuration of conductive signal element 212 and/or conductive reference elements 214, 216 may vary to compensate for the presence of a dielectric underfill material (described in more detail below).

Conductive signal element 212 ends at a suitably configured bond pad 240 formed on second substrate 210. In the example embodiment, bond pad 240 is substantially round in shape, which enhances the impedance matching of transition interface structure 200, especially when appropriately sized to maintain the solder bump diameter during flip-chip bonding. In a practical implementation, bond pad 240 may be realized as a multi-sided polygon having a large number of sides that effectively form a circular shape. Bond pad 240 is suitably sized, shaped, and configured to accommodate a conductive interconnect element, e.g., solder bump 220. In the example embodiment, bond pad 240 is approximately 120 microns in diameter.

Conductive reference element 214 includes a substantially curved edge 244, and conductive reference element 216 includes a substantially curved edge 246. As described above in connection with die substrate 202, each of the curved edges 244, 246 is primarily arcuate in shape, i.e., each curved edge 244, 246 substantially defines a circular arc having a radius of about 215 microns. The radius depends on the dielectric constant of the underfill material, the characteristic impedance, and the solder bump diameter. In a practical embodiment, each of the curved edges 244, 246 may be realized as a section of a multi-sided polygon having a large number of sides that effectively forms a curved line. As shown in FIG. 6, curved edges 244, 246 may follow the curvature of curved edges 224, 222, respectively. Thus, the combination of cutout region 226 and cutout region 242 forms a substantially round "enclosure" that partially surrounds bond pad 218, bond pad 240, and solder bump 220.

A cutout region 242 is defined at least in part by curved edges 244, 246; cutout region 242 may be further defined by bond pad 240 and by portions of conductive signal element 212. Cutout region 242 is preferably configured to cooperate with cutout region 226 (see FIG. 4) to enhance the impedance matching of transition interface structure 200. In this regard, cutout region 242, like cutout region 226, may be configured in accordance with a suitable impedance matching criteria. Bond pad 218, bond pad 240, and solder bump 220 are approximately centered within the round cutout regions 226, 242. In addition, conductive signal element 204 and conductive signal element 212 are approximately centered within cutout regions 226, 242, i.e., the signal elements extend radially from the respective bond pads.

Conductive reference element 214 includes a reference bond pad 248 configured to accommodate a conductive interconnect element, e.g., solder bump 236. In the example embodiment, reference bond pad 248 is located at protruding extremity 250 of conductive reference element 214. Similarly, conductive reference element 216 includes a reference bond pad 252 configured to accommodate solder bump 230. As shown in FIG. 5 and FIG. 6, reference bond pad 252 is located at protruding extremity 254 of conductive reference element 216. The positions of bond pad 240, reference bond pad 248, and reference bond pad 252 on substrate 210 are determined in accordance with a suitable impedance matching criteria to enhance the impedance matching characteristics of transition interface structure 200.

In the illustrated embodiment, solder bump 230 is located at curved edge 246 and solder bump 236 is located at curved edge 244. As shown in FIG. 5 and FIG. 6, the contact footprint of solder bump 230 approaches curved edge 246 at protruding extremity 254. Similarly, the contact footprint of solder bump 236 approaches curved edge 244 at protruding extremity 250. As mentioned above, the positions of solder bumps 230, 236 at curved edges 246, 244 are selected to improve the impedance matching and reduce the return loss associated with transition interface structure 200.

As shown in FIG. 6, a portion of conductive reference element 208 overlaps a portion of conductive reference element 214, and a portion of conductive reference element 206 overlaps a portion of conductive reference element 216. In a practical embodiment, the amount of overlap can affect the performance of transition interface structure 200. For this reason, the conductive reference elements may be suitably configured to optimize the amount of overlap proximate the reference solder bumps.

Referring back to FIG. 1 and FIG. 2, an alternate configuration for the second substrate portion employs conductive reference elements 116, 124 that define little or no cutout region on second substrate 104. As shown in FIG. 2, conductive reference elements 116, 124 are relatively straight in the area surrounding signal solder bump 108. Nonetheless, some performance benefits are derived from the curved cutout region formed on die substrate 102.

As described above, and as shown in FIG. 3, an assembled package may include dielectric underfill material 112 between the flip-chip die and the second substrate. Using conventional manufacturing techniques, dielectric underfill material 112 can be deposited between the two substrates to provide additional structural support and stress relief to the assembly. In practice, a small residual amount of dielectric underfill material 112 extends beyond the edge of the flip-chip die, as shown in FIG. 1 and FIG. 2. In FIG. 6, the edge of die substrate 202 is identified by the line 256 and the edge of the protruding dielectric underfill material 112 is identified by the line 258. In one practical embodiment, the underfill material has a dielectric constant of approximately 4.0. The dielectric material may be a particle-filled polymer resin. The filler particles can be either glass or ceramic beads.

The conductive signal element on the second substrate and/or either of the conductive reference elements on the second substrate can be configured according to electrical and physical properties of dielectric underfill material 112, e.g., the dielectric constant of the material 112, the physical dimensions of the material 112, and the like. In addition, any number of these conductive elements can be configured in accordance with an impedance matching criteria to enhance the impedance matching of the transition interface structure. In practice, due to the presence of dielectric underfill material 212, the transmission line is capacitively loaded, which reduces characteristic impedance. To maintain the desired overall transmission impedance, the conductive elements can be adjusted to compensate for the dielectric loading. For example, the gap between conductive signal element 120 and the conductive reference elements is relatively narrow in the coplanar waveguide region (depicted at the bottom of FIG. 2), and relatively wide in the transition region proximate solder bumps 106, 108, 110. The gap width in the intermediate region (i.e., the region covered by the excess dielectric underfill material 112) is greater than the gap width-in the coplanar waveguide region. The specific gap width is selected in response to the particular dielectric underfill material 112, its properties, and its dimensions in the assembled package. The gap width in the transition region is even wider than for the intermediate region. The gap width and signal conductor line width are selected in response to both the dielectric underfill material 112 and the die 102, which both present dielectric loading in this region. Thus, a constant characteristic impedance can be realized with a variation in the width of conductive signal element 120 and/or with a variation in the configuration of conductive reference elements 116, 124. The transitions from one capacitively loaded section to another may include mitered corners in the conductive elements. The mitered corners facilitate a smoother signal transition from one transmission section to another. In this example embodiment, the signal conductor is approximately 100 microns wide and the gap is approximately 140 microns wide in the transition region proximate solder bumps 106, 108, and 110.

The embodiment shown in FIG. 6 utilizes a different approach to compensate for the dielectric loading. Conductive signal element 212 has a relatively wide section corresponding to the coplanar waveguide region, a relatively narrow section corresponding to the transition region proximate the solder bumps, and an intermediate section corresponding to the region covered by the excess dielectric underfill material. In contrast to the embodiment shown in FIG. 1 and FIG. 2, the conductive reference elements 214, 216 are not stepped or notched; the characteristic impedance is normalized by simultaneous reduction of the signal conductor line width and increase in the gap width, which results from the variation in the width of the conductive signal element 212. In this embodiment, the signal conductor varies continuously from about 140 microns wide to about 100 microns wide, as the amount of dielectric loading increases.

It should be noted that the specific dimensions of the transition interface elements can vary according to characteristic impedance, frequency, or size requirements. Indeed, the size of the transmission interface elements and/or the feeding coplanar waveguides can be scaled according to an appropriate scaling factor. The scaling factor for determining the coplanar waveguide characteristic impedance is dependent on the geometrical factor W/(W+2G), where W is the signal conductor width and G is the gap width. The solder bumps can be modeled as three parallel conductive wires, and the three-wire transmission line characteristic impedance is dependent on the geometrical factor $$\left[\frac{H}{d} + \sqrt{\left(\frac{H}{d}\right)^2 - 1}\,\right],$$

which can be approximated by the relationship $$\frac{\left(2H - \frac{d}{2}\right)}{d},$$

where d is the wire diameter and H is the wire pitch.

The transition interface configuration with a round signal bond pad, a round cutout region, and central signal element can be modeled like a split coaxial cable. The characteristic impedance for a split coaxial cable scales according to b/d, where b is the diameter of the ground shield and d is the diameter of the central signal conductor.

In all three of the above cases, the scaling factor essentially ratios the signal conductor width or diameter with the ground-to-ground conductor spacing. These scaling ratios suggest (to first-order) that a unified scaling factor for the transition interface structure is simply B/(2p−B), where B is the bump diameter and p is the bump pitch. In this regard, the following parameters are scalable in a practical embodiment: solder bump diameter; solder bump pitch; ground cutout diameter; and bond pad diameter. Manufacturing limitations for flip-chip assembly typically dictate the smallest values that B or p can assume. As these manufacturing limits improve, the transition interface structure can be scaled appropriately. Currently, it is possible to realize a range of bump diameters from as small as 25 microns to as large as 1 millimeter. It is feasible to imagine that the smallest bump diameter will be only a few microns some time in the future.

Example dimensions for feeding coplanar waveguides given above are not intended to limit the scope or application of the invention and, therefore, the range of allowable feeding coplanar waveguides dimensions is not scaled according to the transition interface. The feeding coplanar waveguide dimensions can be determined independent of the transition interface, except for the constraint that the quantity (W+2G) for the feeding waveguide without any dielectric loading has to be smaller than or equal to the ground-bump to ground-bump spacing, which is represented by the quantity (2p−B).

Figure 7A:
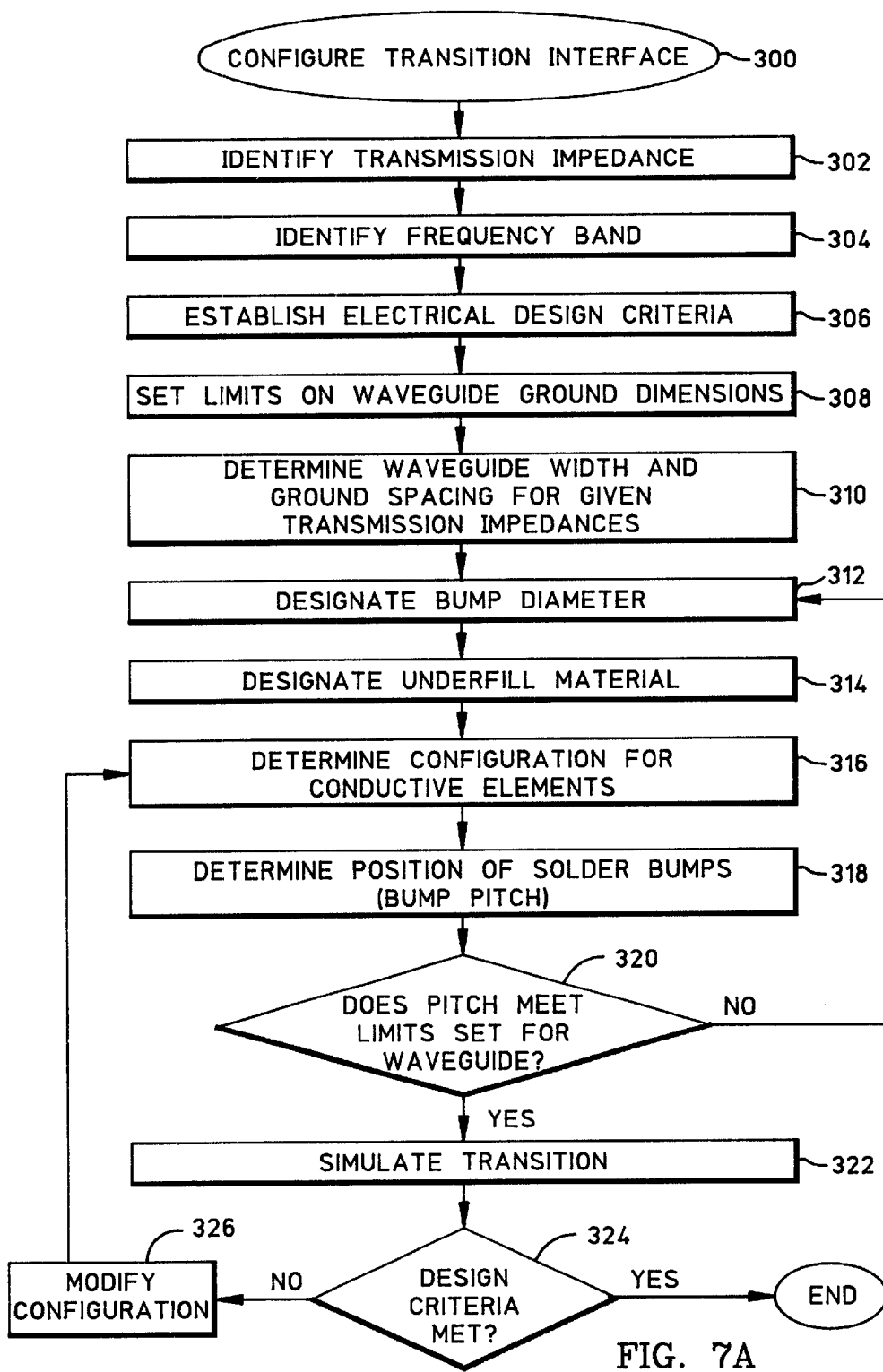
FIGS. 7A and 7B are flow charts depicting processes for configuring a transition interface structure.

FIG. 7A is a flow diagram that depicts one example process 300 for configuring a transition interface structure. For purposes of this description, process 300 relates to the design of a component package that includes a device, the transition interface structure, and a substrate upon which the device is mounted. Of course, process 300 can be suitably modified to design only the device portion of the transition interface structure or to design only the substrate portion of the transition interface structure. Process 300, or portions thereof, may be performed by one or more computer programs, e.g., computer-aided design programs, simulation programs, modeling programs, or the like. One commercially available program is the HFSS simulation software from Ansoft Corporation. In this regard, process 300, or portions thereof, can accept data, such as design parameters, from a user of a simulation program and/or from another software application. Furthermore, some of the tasks associated with process 300 need not be performed in the order shown in FIG. 7, and a number of the tasks may be performed concurrently or in connection with any number of subprocesses.

As described above, a transition interface structure allows a flip-chip device to be directly connected to a substrate, e.g., another die substrate, an interconnect substrate, a circuit board, or the like. In a high frequency application, the signals are transmitted via waveguides. In one practical application, the respective signal is generated by the flip-chip circuitry, transmitted by a first coplanar waveguide formed on the flip-chip die substrate, transferred to the second substrate by the transition interface structure, and transmitted by a second coplanar waveguide formed on the second substrate.

A task 302 identifies a transmission impedance for the coplanar waveguides; in many practical applications, the designated transmission impedance will be identical for both waveguides. For example, most high speed devices for use in optoelectronic components have a 50 Ohm signal input impedance. Thus, the designated transmission impedance may also apply to the transition interface structure. Alternatively, task 302 can individually identify a transmission impedance for the device waveguide, a transmission impedance for the second waveguide, and/or a transmission impedance for the transition interface structure.

A task 304 identifies a frequency band for the package. The identified frequency band applies to the frequency of signals generated by the device, signals transmitted by the waveguides, and signals transmitted by the transition interface structure. The techniques of the present invention are suitable for use in connection with high frequency broadband applications. In this context, a broadband application is one that accommodates frequencies that span multiple octaves. In digital applications, rise time requirements determine bandwidth requirements. For example, in one practical embodiment, the operating frequency band is DC to 72 GHz. In other practical applications, the operating frequency band may be DC to 120 GHz.

A task 306 can establish electrical design criteria associated with the desired performance of the transition interface structure. For example, task 306 may define impedance matching criteria, e.g., return loss characteristics of the transition interface structure over the designated frequency band. Task 306 may also define rise time and insertion loss characteristics. In one practical application, the return loss of the transition interface structure must not exceed −15 dB for frequencies between DC to 72 GHz. Process 300 can utilize the design criteria to determine if the proposed configuration is satisfactory or if the proposed configuration should be further modified.

The characteristics and configuration of the waveguides can be suitably defined or designated in connection with tasks 308 and 310. For example, in task 308, limits are set on the waveguide ground dimensions. Task 310 determines waveguide width and ground spacing for the given transmission impedances. The definition of the waveguides may include, for example, any number of the following parameters: the size, shape, and layout of the conductive signal elements; the size, shape, and layout of the conductive reference elements; the gap widths between the conductive elements; and the thickness of the metal layers.

In accordance with one practical embodiment, the designer is able to designate the bump diameter (task 312). In addition, a task 314 designates properties of a dielectric underfill material located between the die substrate and the second substrate. Task 314 may include the designation of physical and/or electrical properties of the underfill material, e.g., the dielectric permittivity, the physical dimensions, the chemical composition of the material, filler size, and the like. In practice, task 314 obtains data sufficient as input to a simulation model of the dielectric underfill material; process 300 can eventually model the entire transition interface structure and simulate its performance over the designated frequency band. Consequently, the process may continue to model any number of elements or features of the transition interface structure. This allows a designer to model any of the following features by their physical dimensions, electrical properties, and configuration relative to each other: the die substrate; the conductive elements on the die substrate (including the bond pads); the solder bumps; the dielectric underfill material (as described above in connection with task 314); the second substrate; and the conductive elements on the second substrate (including the bond pads). This feature enables the designer to initially define the transition interface such that process 300 can simulate the performance of the initial design and optimize its configuration in an iterative manner.

A task 316 is performed to determine the configuration of the various conductive elements, and a task 318 is performed to determine the positions of the solder bumps on the conductive elements. These tasks can be performed to improve the performance of the transition interface structure and to ensure that the transition interface structure satisfies the design criteria. In accordance with the techniques of the present invention, the configuration of the conductive elements and the positions of the solder bumps are determined based on the designated transmission impedance, the designated frequency band, the designated dielectric underfill material, and/or the designated impedance matching criteria. Tasks 316 and 318 can result in the configuration of any number of the following features: the bond pads; the conductive signal elements; the conductive reference elements; the positions of the solder bumps on the respective conductive elements; a pitch (i.e., the center-to-center distance) between the signal solder bump and each of the reference solder bumps; the overlapping regions corresponding to the conductive reference elements; and the cutout regions surrounding the signal bond pads. These features are described in detail above in connection with FIGS. 1–6. Of course, other features and characteristics of the transition interface structure may be determined by process 300.

In accordance with the illustrated examples, process 300 may ultimately set the position of the reference solder bumps immediately adjacent to the respective cutout region. As shown in FIG. 6, the reference solder bumps are positioned at the edge of the conductive reference elements, and adjacent to the cutout regions. In addition, process 300 may ultimately minimize (within practical limits) the amount of overlap between the conductive reference elements formed on the die substrate and the conductive reference elements formed on the second substrate.

A query task 320 may be performed to check whether the calculated bump pitch meets the limits set for the waveguide. If not, then process 300 is reentered at task 312 to allow the designer to designate one or more different parameters. If so, then process 300 simulates the transition (task 322) using any number of known simulation techniques. A query task 324 may be performed to check whether the designated design criteria has been met. If so, then process 300 exits and the proposed design can be finalized. Otherwise, a task 326 can modify the configuration of the proposed transition interface structure in an attempt to further optimize the design. Task 326 may be performed automatically by the software application and/or in response to any number of user inputs. Task 326 can modify the configuration of one or more components, e.g., the position of the solder bumps, the shape of the cutout region, the gap width(s) between the conductive signal element and the conductive reference elements; the size of the bond pads, or the like.

Following task 326, process 300 can be re-entered at task 316. In this manner, the configuration of the transition interface structure can be changed in an iterative manner until an acceptable design is reached or until process 300 is terminated.

Figure 7B:
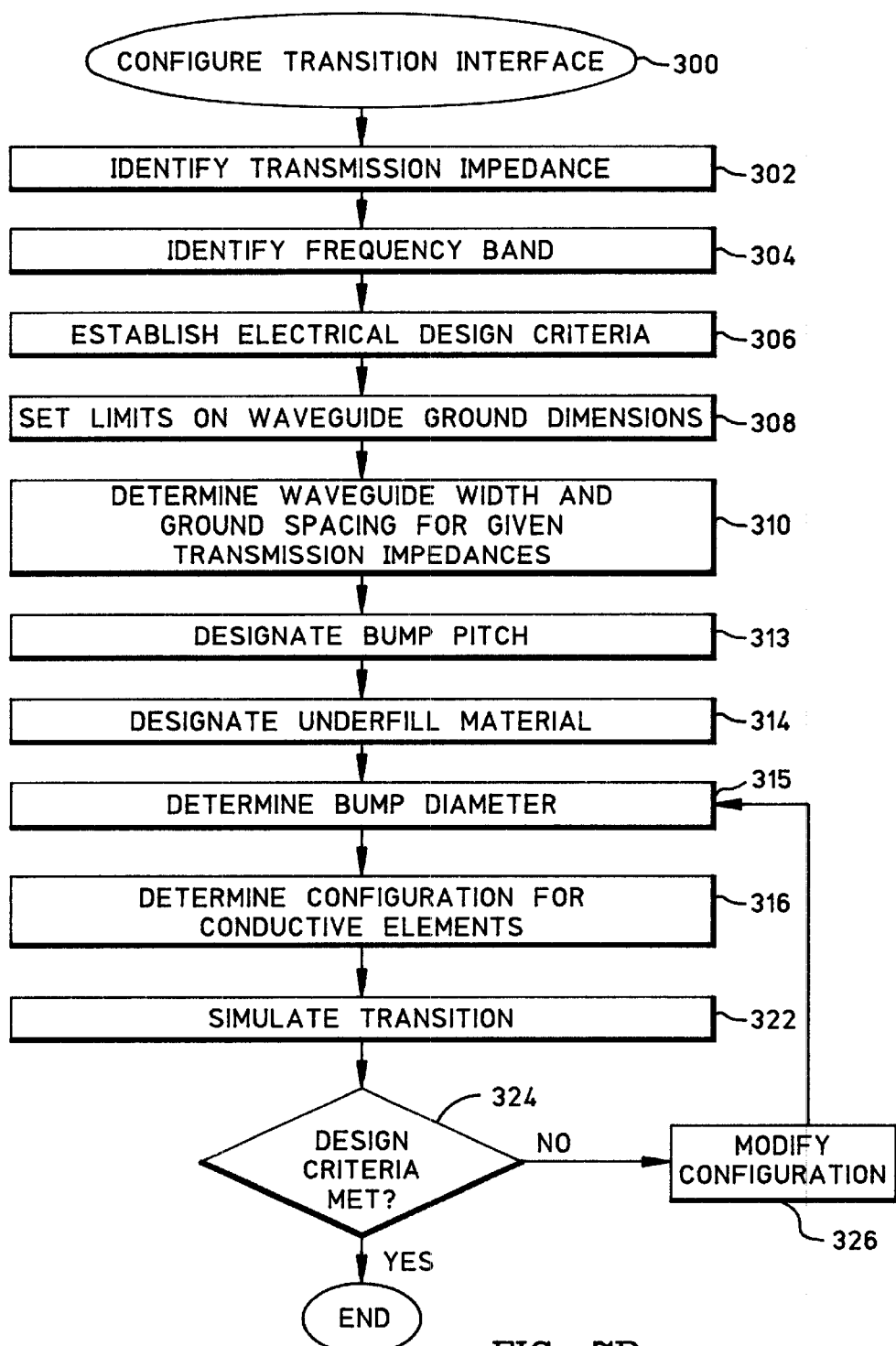

FIG. 7B is a flow diagram of an alternate process 300. In this version, a task 313 allows the designer to designate the solder bump pitch rather than the solder bump diameter. Consequently, process 300 eventually determines the bump diameter (task 315) rather than the bump pitch. A task 326 can modify the configuration of the proposed transition interface structure in an attempt to further optimize the design. Following task 326, process 300 can be re-entered at task 315. Of course, process 300 may be configured to allow the designer to designate other parameters and to allow the simulation to determine other quantities.

The present invention has been described above with reference to a preferred embodiment. However, those skilled in the art having read this disclosure will recognize that changes and modifications may be made to the preferred embodiment without departing from the scope of the present invention. For example, the physical dimensions of a transition interface structure can vary according to scaling factors so long as the designated transmission impedance is maintained. Thus, a number of different physical layouts can function in an equivalent manner. These and other changes or modifications are intended to be included within the scope of the present invention, as expressed in the following claims.

What is claimed is:

1. A flip-chip transition interface structure comprising:
a coplanar waveguide formed on a substrate, said coplanar waveguide comprising a conductive signal element, a first conductive reference element, and a second conductive reference element;
a first solder bump located on said conductive signal element;
a second solder bump located on said first conductive reference element; and
a third solder bump located on said second conductive reference element;
wherein the position of said first solder bump on said conductive signal element, the position of said second solder bump on said first conductive reference element, and the position of said third solder bump on said second conductive reference element are determined in accordance with an impedance matching criteria.

2. A flip-chip transition interface structure according to claim 1, wherein:
said conductive signal element ends at a substantially round bond pad;
said first solder bump is located on said bond pad;
said first conductive reference element includes a first substantially curved edge;
said second conductive reference element includes a second substantially curved edge; and
said flip-chip transition interface structure further comprises a cutout region defined at least in part by said first curved edge and said second curved edge.

3. A flip-chip transition interface structure according to claim 2, wherein:
said second solder bump is located at said first curved edge; and
said third solder bump is located at said second curved edge.

4. A flip-chip transition interface structure according to claim 2, wherein said cutout region is configured in accordance with said impedance matching criteria.

5. A flip-chip transition interface structure according to claim 1, wherein said substrate is a die substrate.

6. A flip-chip transition interface structure according to claim 1, further comprising:
a second conductive signal element formed on a second substrate, said first solder bump coupling said conductive signal element to said second conductive signal element;
a third conductive reference element formed on said second substrate, said second solder bump coupling said first conductive reference element to said third conductive reference element; and
a fourth conductive reference element formed on said second substrate, said third solder bump coupling said second conductive reference element to said fourth conductive reference element.

7. A flip-chip transition interface structure comprising:

a coplanar waveguide formed on a substrate, said coplanar waveguide comprising a conductive signal element, a first conductive reference element having a first substantially curved edge facing said conductive signal element, and a second conductive reference element having a second substantially curved edge facing said conductive signal element;

a first solder bump located on said conductive signal element;

a second solder bump located on said first conductive reference element; and a third solder bump located on said second conductive reference element;

wherein the position of said first solder bump relative to said conductive signal element, the position of said second solder bump relative to said first conductive reference element, and the position of said third solder bump relative to said second conductive reference element are optimized in accordance with an impedance matching criteria.

8. A flip-chip transition interface structure according to claim 7, further comprising a cutout region defined at least in part by said first substantially curved edge and said second substantially curved edge.

9. A flip-chip transition interface structure according to claim 8, wherein said cutout region is configured according to said impedance matching criteria.

10. A flip-chip transition interface structure according to claim 7, wherein each of said first substantially curved edge and said second substantially curved edge is formed by a plurality of segmented edge sections.

11. A flip-chip transition interface structure according to claim 7, wherein said second solder bump is located along said first substantially curved edge and said third solder bump is located along said second substantially curved edge.

12. A flip-chip transition interface structure according to claim 7, further comprising:

a second conductive signal element formed on a second substrate, said first solder bump coupling said conductive signal element to said second conductive signal element;

a third conductive reference element formed on said second substrate, said second solder bump coupling said first conductive reference element to said third conductive reference element; and a fourth conductive reference element formed on said second substrate, said third solder bump coupling said second conductive reference element to said fourth conductive reference element.

13. A flip-chip transition interface structure according to claim 12, further comprising a dielectric underfill material located between said substrate and said second substrate.

14. A flip-chip transition interface structure according to claim 13, wherein at least one of said second conductive signal element, said third conductive reference element, and said fourth conductive reference element is configured according to electrical properties and physical dimensions of said dielectric underfill material.

15. A flip-chip transition interface structure according to claim 14, wherein at least one of said second conductive signal element, said third conductive reference element, and said fourth conductive reference element is configured according to said impedance matching criteria.

* * * * *